US010305164B1

(12) United States Patent
Burrell

(10) Patent No.: US 10,305,164 B1
(45) Date of Patent: May 28, 2019

(54) GANG JUNCTION BOX ANTENNA ENCLOSURE AND ANTENNA ASSEMBLY

(71) Applicant: TESSCO Communications Incorporated, Hunt Valley, MD (US)

(72) Inventor: Dennis Burrell, Austin, TX (US)

(73) Assignee: TESSCO COMMUNICATIONS INCOPORATED, Hunt Valley, MD (US)

( * ) Notice: Subject to any disclaimer, the term of this patent is extended or adjusted under 35 U.S.C. 154(b) by 143 days.

(21) Appl. No.: 14/928,293

(22) Filed: Oct. 30, 2015

(51) Int. Cl.
*H01Q 1/22* (2006.01)
*H05K 5/03* (2006.01)
*H05K 5/02* (2006.01)

(52) U.S. Cl.
CPC ......... *H01Q 1/2291* (2013.01); *H05K 5/0204* (2013.01); *H05K 5/03* (2013.01)

(58) Field of Classification Search
CPC ........ H01Q 1/007; H01Q 1/12; H01Q 1/1221; H01Q 1/125; H01Q 1/1264; H01Q 3/02; H01Q 3/04; H01Q 3/06; H01Q 1/2291; H01Q 1/246; H01Q 1/1214
USPC .......................................................... 343/702
See application file for complete search history.

(56) References Cited

U.S. PATENT DOCUMENTS 5,619,217 A 4/1997 Mailandt et al.
5,736,965 A * 4/1998 Mosebrook ............ H01Q 1/007 315/312
6,097,339 A * 8/2000 Filipovic ................ H01Q 1/243 343/700 MS
6,744,399 B2 * 6/2004 Tohyama .............. G01S 7/4026 342/165
7,113,144 B2 * 9/2006 Lin ........................ H01Q 1/125 343/880
7,478,759 B2 * 1/2009 Lung ...................... H01Q 1/242 235/492
8,351,987 B2 1/2013 Boch
8,466,965 B2 * 6/2013 Murphy ................. H01Q 1/125 348/184
8,644,774 B2 2/2014 Shrum et al.
8,842,049 B2 * 9/2014 Anand ................... H01Q 1/241 343/702
8,947,319 B2 2/2015 Simmons et al.
9,450,300 B2 * 9/2016 Yemelong ................ H01Q 1/38
2007/0279310 A1 * 12/2007 Tsai ..................... H01Q 1/1207 343/795
2009/0255725 A1 10/2009 Curtis
(Continued)

FOREIGN PATENT DOCUMENTS

DE 4217426 A1 * 12/1993 ............ G01S 7/032

*Primary Examiner* — Daniel Munoz
*Assistant Examiner* — Patrick R Holecek
(74) *Attorney, Agent, or Firm* — Shlesinger, Arkwright & Garvey LLP

(57) ABSTRACT

An enclosure for an antenna comprises a gang junction box configured to be flush mounted to a wall, the gang box including first and second sidewalls opposite to each other; a removable cover attached to the gang junction box, the cover being transparent to electromagnetic radiation; a base for supporting an antenna, the base being disposed inside the gang box; the base including an axis of rotation at an upper portion, the base is pivotably attached at the upper portion along the axis to the first and second sidewalls; and the base is lockable to the first and second sidewalls after the base is pivoted to a desired orientation.

15 Claims, 3 Drawing Sheets

(56) References Cited

U.S. PATENT DOCUMENTS

| | | | | |
|---|---|---|---|---|
| 2014/0230342 | A1 | 8/2014 | Macioch et al. | |
| 2014/0273865 | A1 * | 9/2014 | Skarda | H01Q 1/084 455/66.1 |

* cited by examiner

GANG JUNCTION BOX ANTENNA ENCLOSURE AND ANTENNA ASSEMBLY

FIELD OF THE INVENTION

The present invention is generally directed to antenna enclosures and particularly to antenna enclosures and antenna assemblies adapted for installation in an indoor environment where antennas are required to provide various methods of RF propagation from a communication system and where aesthetics and stealth deployments of antennas are important.

BACKGROUND OF THE INVENTION

With the proliferation of smartphones, tablets and PCs, wireless communications is wanted everywhere. The access points (APs) used to provide the wireless coverage is typically mounted to the ceilings inside a building to provide the coverage needed to provide connectivity to the client devices (smart phones, tablets, laptops, etc.). Depending on the amount of users on the access point, external antennas remote from the access point may need to be used to provide adequate coverage. While this provides the needed coverage, the size of the antennas may be an unwanted sight for buildings where aesthetics are paramount.

SUMMARY OF THE INVENTION

An enclosure for an antenna comprises a gang junction box configured to be flush mounted to a wall, the gang box including first and second sidewalls opposite to each other; a removable cover attached to the gang junction box, the cover being transparent to electromagnetic radiation; a base for supporting an antenna, the base being disposed inside the gang box; the base including an axis of rotation at an upper portion, the base is pivotably attached at the upper portion along the axis to the first and second sidewalls; and the base is lockable to the first and second sidewalls after the base is pivoted to a desired orientation.

The present invention also provides an antenna assembly, comprising a gang junction box; an antenna disposed on a planar substrate inside the gang junction box; and cable pigtails extending outside the gang junction box, the cable pigtails are operably connected to the antenna.

DETAILED DESCRIPTION OF THE INVENTION

Figure 1:
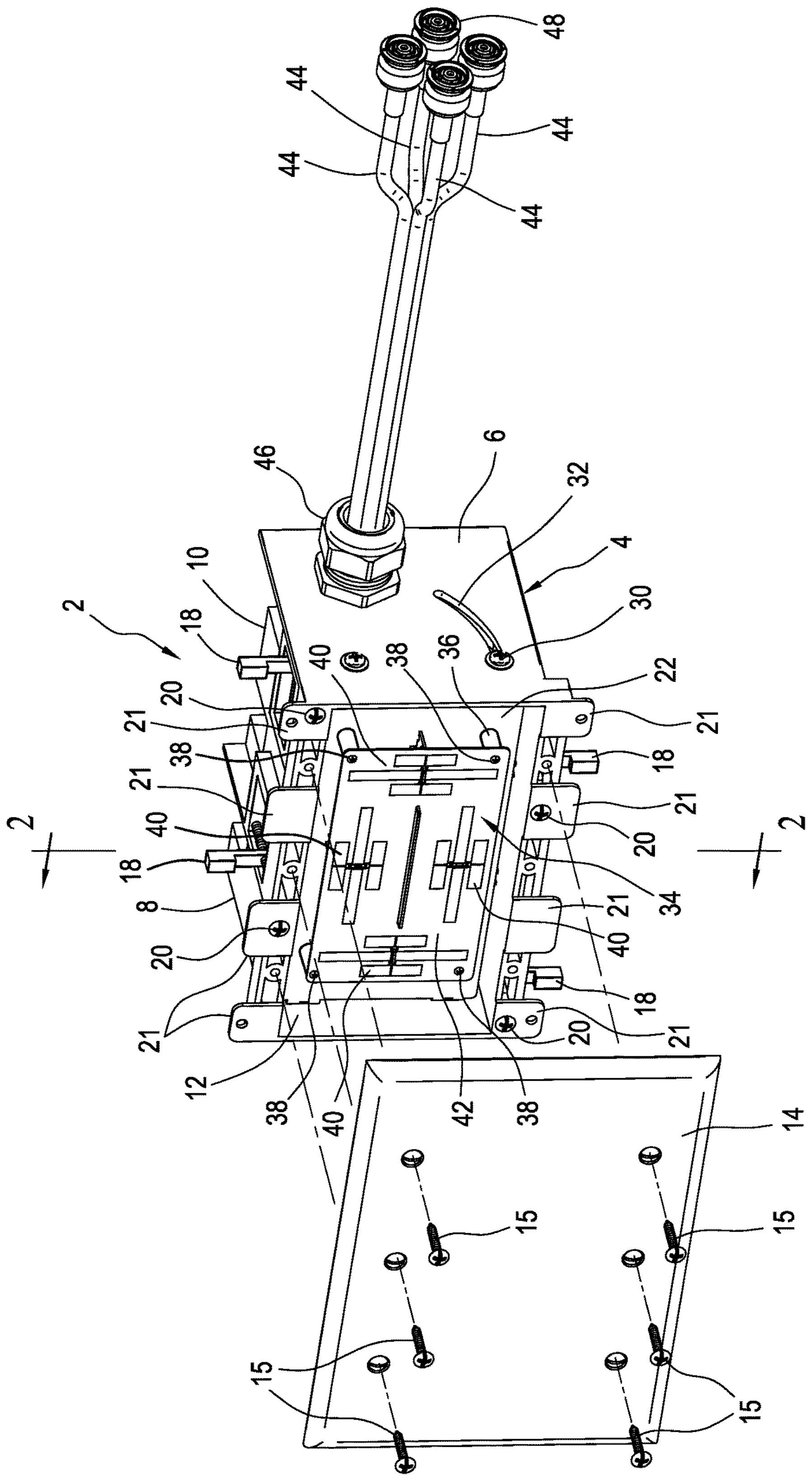
FIG. 1 is a perspective assembly drawing of an enclosure for an antenna embodying the present invention, showing an antenna oriented along the vertical plane.

Referring to FIG. 1, an enclosure 2 for an antenna is disclosed. The enclosure 2 includes a housing 4 with sidewalls 6 and 8, a backwall 10 and an opening 12. A removable cover or faceplate 14 is attached to the housing 4 to close the opening 12.

The housing 4 is preferably made of plastic, such as PVC. The faceplate 14 is made of plastic or any non-conducting material that will let the wireless RF signal pass through it. The faceplate 14 is connected to the front of the housing 4 via six screws 15. The faceplate 14 looks like a light socket cover and is RF friendly so as to not hinder the transmission of wireless RF signal to and from the antenna inside the housing 4.

Figure 2:
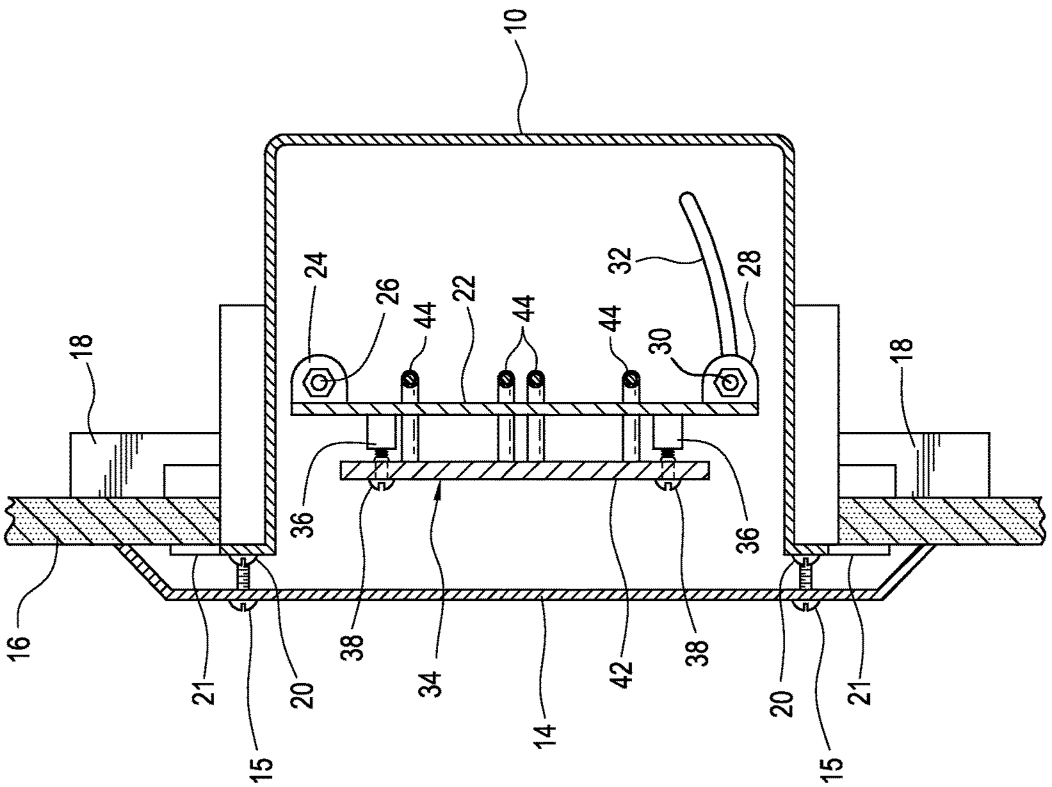
FIG. 2 is a cross-sectional view taken along line 2-2 in FIG. 1.

Referring to FIG. 2, the housing 4 is configured for flush-mounting to a standard stud wall with drywall 16 through a suitable opening in the wall. Wings 18 are drawn toward the backside of the drywall 16 when the screws 20 are tightened, drawing the housing 4 toward the drywall 16 until the tabs 21 engage the front of the drywall 16 and the wings 18 the back of the drywall 16, providing a secure attachment to the drywall 16.

The housing 4 is preferably a standard gang junction box used for building wiring construction, such as that used for electrical outlets or wall switches. The gang junction box is made for flush-mounting in a standard drywall construction of various drywall thicknesses and wall finishes.

A gang junction box is a term in the electrical industry used to indicate a box which houses installed electrical componentry. A 1-gang junction box hosts a single component, such as a switch or receptacle, a 2-gang junction box hosts two components side-by-side, and so on. Basically, the number of components the junction box can hold increases the size of the gang junction box. Gang junction boxes are placed such that they are recessed into the wall and the edge is flush to the wall. The junction box is then covered with a plate so it is hidden. Typical uses for the gang junction box are for light switches and receptacles.

Although the housing 4 is disclosed as being suitable for installation to an existing wall, the housing 4 may also be used for new construction where the wings 18 will not be needed for attachment to the wall structure.

Figure 3:
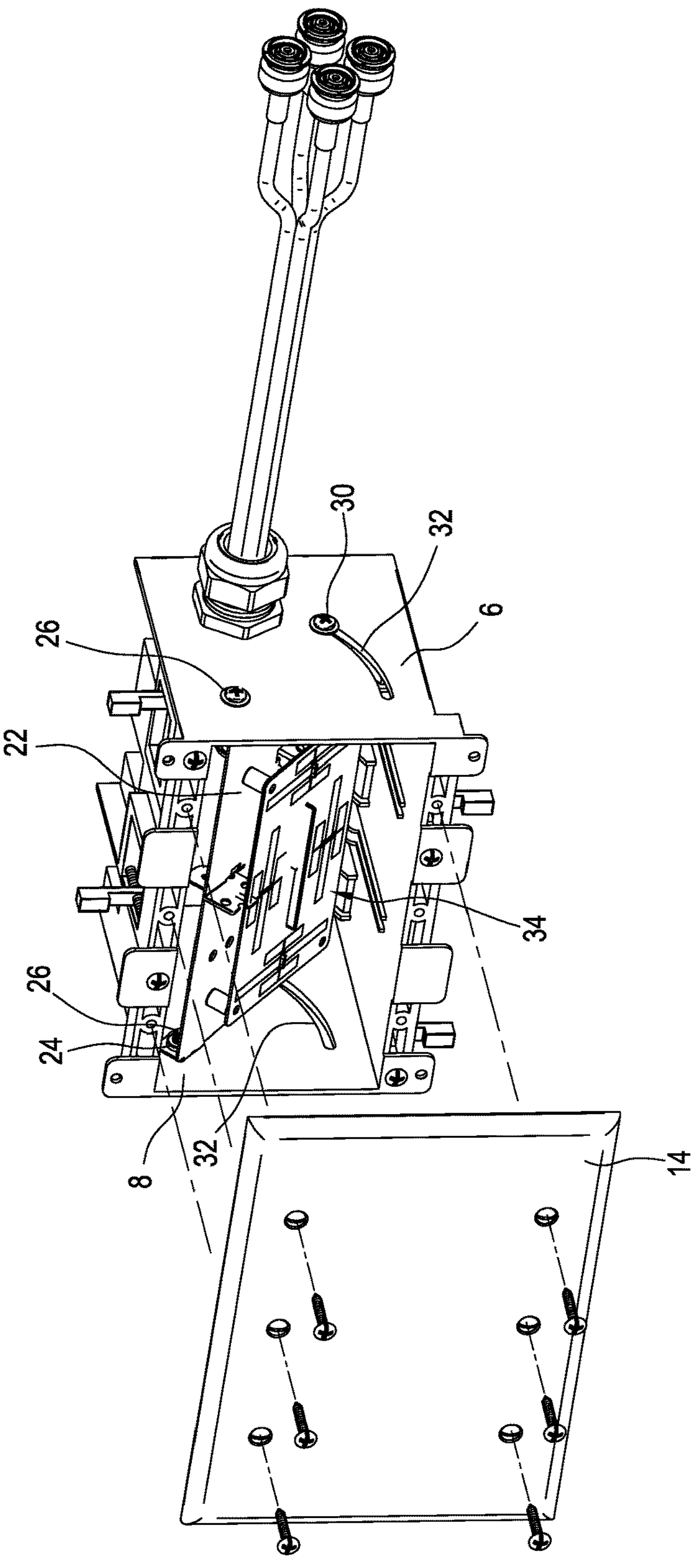
FIG. 3 is a perspective view of the housing showing the antenna oriented inwardly into the housing at an angle from the vertical plane.

Referring to FIGS. 2 and 3, a base 22, preferably a rigid planar plastic plate, is disposed inside the housing 4 in a pivotable manner so that the base 22 can be oriented from the vertical plane between 0-45°, preferably between 15-45°. The base 22 includes right angle tabs 24 at the upper portion that are secured to the sidewalls 6 and 8 with screws 26 to allow the base 22 to pivot about the screws 26. The base 22 further includes tabs 28 attached with screws 30 through arcuate slots 32 in the respective sidewalls 6 and 8. The screws 30 can be tightened against the sidewalls 6 and 8 to advantageously lock the base 22 at the desired orientation.

An antenna 34 is attached to the base 22 via spacers 36 and screws 38. The screws 38 are captured by standard means in a preferably planar substrate 42 such that turning the screws 38 do not cause the screws 38 to translate relative to the substrate 42. The screws 38 are threaded into the spacers 36 such that turning the screws 38 will cause the substrate 42 to move toward or away from the spacers 36, depending on the direction the screws 38 are turned. The spacers 36 are fixedly attached to the base 22. The substrate 42 is preferably rigid to allow the small adjustments provided by the screws 38. The substrate 42 is preferably a printed circuit board.

The lower or upper screws 38 advantageously function as a fine-tune adjustment while the screws 30 along with the slots 32 function as coarse adjustment. When the base 22 is oriented in the desired located via the slots 32, the screws 30 are then tightened to lock the base 22 in place, thereby positioning the antenna 34 in the desired orientation. When the pair of lower screws 38 is turned clockwise, the substrate 42 turns inwardly at the bottom portion. When the pair of lower screws 38 is turned counterclockwise, the substrate 42 turns outwardly at the lower portion. The result is that the orientation of the antenna 34 is further adjusted by small amounts after the coarse adjustment with the screws 30 has been made. The upper pair of screws 38 may also be adjusted in the same manner to adjust the orientation of the antenna 34.

As already seen above, the slots 32 and the screws 30 provide the means for tilting the antenna 34 to properly orient the antenna 34 in space for adequate coverage of the RF signal. The articulation angle of the antenna 34 is fixed by the screws 30 on each sidewall 6 and 8 of the gang junction box 4. Depending on the direction the gang junction box 4 is placed into the wall (antenna cables on the left side or on the right side of the gang junction box), the tilting means can provide down tilt or up tilt of the antenna. The tilting means advantageously allows for coarse articulation of the antenna before the gang junction box is affixed to the wall finish or sheet rock. Once the housing 4 is fixed to the wall, fine tuning can occur by means of the two screws 38 at the base or the top of the antenna, depending on the direction the gang junction box is placed into the wall.

The housing 4 may also be installed rotated 180° on the vertical plane from that shown in FIGS. 1 and 3 so that the antenna 34, instead of facing downwardly as shown in FIG. 3, will be facing upwardly, depending on the need of the application. The housing 4 may also be installed on the ceiling, if desired.

The antenna 34 is conventional and include antenna radiator elements 40 attached to the substrate 42. The antenna radiator elements 40 are operably connected to cable pigtails 44 that exit through the sidewall 6 via a cord grip connector 46 attached to a hole in sidewall 6. The cable pigtails 44 can also exit through the sidewall 8 or the backwall 10. The cable pigtails 44 have connectors 48 that connect to the access point/radio (not shown) that provides the wireless communications via another set of cables (not shown) connected to the access point that are routed within the wall and brought to near the housing 4 for connecting to the cable pigtails 44. The type of the connectors 48 will depend on the type of wireless access point/radio that is being used. The connectors 48 typically used are Reverse Polarity Threaded Neill-Concelman (RPTNC) and Reverse Polarity Subminiature version A (RPSMA). The cable pigtails 44, while 4 are shown, may also be 2, 3, 5, 6 or 8, depending on the number of ports of the radio being used. Antenna radiator elements 40 are used to propagate RF signal from the antennas to the client (user device) and to receive RF signal from the client device. The antenna radiator elements 40 connect to the radio that provides the wireless signal via coaxial cables. The number of connectors attached to the radiator elements 40 of the antenna depends on the type of wireless radio being used. This in turn determines the size of the gang junction box 4 used for the antenna system. The number of connectors (ports of the radio) can number 2, 3, 4, 5, 6 or 8.

The enclosure 2 advantageously provides an aesthetic and stealth type solution in an indoor environment, such as an office building, for connection to a wireless communication system for deployments where obtrusive wireless components (antennas, mounts, cables, etc.) are frowned upon.

The present invention advantageously provides a solution to providing an antenna inside a building or similar environment where exposed antennas would detract from aesthetics of the environment.

While this invention has been described as having preferred design, it is understood that it is capable of further modification, uses and/or adaptations following in general the principle of the invention and including such departures from the present disclosure as come within known or customary practice in the art to which the invention pertains, and as may be applied to the essential features set forth, and fall within the scope of the invention or the limits of the appended claims.

I claim:

1. An antenna assembly for an access point, comprising:

a) a gang junction box;

b) an access point antenna disposed on a planar substrate inside the gang junction box;

c) cable pigtails extending outside the gang junction box, the cable pigtails including first ends operably connected to the antenna inside the gang junction box and second ends disposed outside the gang junction box;

d) connectors operably connected to the second ends disposed outside the gang junction box, the connectors for connecting to an access point outside the gang junction box;

e) the gang junction box is configured to be flush mounted to a wall, the gang junction box including first and second sidewalls opposite to each other;

f) a removable cover attached to the gang junction box, the cover being transparent to electromagnetic radiation;

g) a base for supporting the planar substrate, the base being disposed inside the gang junction box;

h) the base including an axis of rotation, the base is pivotably attached at opposite ends of the axis to the first and second sidewalls; and i) the base is lockable after the base is pivoted to a desired orientation.

2. The antenna assembly as in claim 1, wherein the cable pigtails extend through a sidewall of the gang junction box.

3. The antenna assembly as in claim 1, wherein the planar substrate is pivotable.

4. The antenna assembly as in claim 1, wherein a lower portion of the base is slidably attached to the first and second sidewalls.

5. The antenna assembly as in claim 4, wherein:

a) the first and second sidewalls each includes an arcuate slot;

b) first and second screws are slidably disposed in respective arcuate slots of the first and second sidewalls;

c) the first and second screws are attached to the lower portion of the base; and d) the first and second screws are lockable to the respective first and second sidewalls to fix the base at the desired orientation.

6. The antenna assembly as in claim 1, wherein:

a) spacers are attached to upper and lower portions of the base;

b) screws at the upper portion and the lower portion of the base are threadedly received in the spacers for securing the planar substrate to the base.

7. The antenna assembly as in 6, wherein the screws at the lower portion of the base are configured to adjust an orientation of the planar substrate relative to the base.

8. The antenna assembly as in 6, wherein the screws at the upper portion of the base are configured to adjust an orientation of the planar substrate relative to the base.

9. The antenna assembly as in claim 1, wherein the base is pivotable about 15-45° from a vertical plane.

10. The antenna assembly as in claim 7, wherein the planar substrate is adjustable by turning the screws at the lower portion of the base less than a revolution.

11. The antenna assembly as in claim 1, wherein the gang junction box is plastic.

12. The antenna assembly as in claim 1, wherein the base is a plastic plate.

13. The antenna assembly as in claim 1, wherein the gang junction box is configured for installation in an existing wall.

14. The antenna assembly as in claim 1, wherein the connectors are Reverse Polarity Threaded Neill-Concelman (RPTNC) connectors.

15. The antenna assembly as in claim 1, wherein the connectors are Reverse Polarity Subminiature version A (RPSMA) connectors.

* * * * *